United States Patent [19]

Ogihara et al.

[11] Patent Number: 4,764,233

[45] Date of Patent: Aug. 16, 1988

[54] PROCESS FOR PRODUCING A CERAMIC MULTI-LAYER CIRCUIT BOARD

[75] Inventors: Satoru Ogihara; Nobuyuki Ushifusa, both of Hitachi, Japan

[73] Assignee: Hitachi, Ltd., Tokyo, Japan

[21] Appl. No.: 862,169

[22] Filed: May 12, 1986

Related U.S. Application Data

[63] Continuation of Ser. No. 511,903, Jul. 8, 1983, abandoned.

[30] Foreign Application Priority Data

Jul. 12, 1982 [JP] Japan .................................. 57-119811

[51] Int. Cl.[4] .......................... B32B 18/00; B32B 31/04
[52] U.S. Cl. ........................................ 156/89; 501/4;
501/11; 501/55; 501/60; 501/61; 501/62;
501/63; 501/65
[58] Field of Search ................. 156/89; 501/4, 11, 55,
501/60, 61, 62, 63, 65

[56] References Cited

U.S. PATENT DOCUMENTS

| | | | |
|---|---|---|---|
| 3,762,936 | 10/1973 | Iler | 501/54 |
| 4,133,690 | 1/1979 | Muller | 501/32 |
| 4,256,796 | 3/1981 | Hang et al. | 428/433 X |
| 4,299,873 | 11/1981 | Ogihara et al. | 428/901 X |
| 4,301,324 | 11/1981 | Kumar et al. | 174/68.5 |
| 4,313,026 | 1/1982 | Yamada et al. | 361/414 X |
| 4,391,914 | 7/1983 | Beall | 501/4 |
| 4,415,624 | 11/1983 | Prabhu et al. | 428/901 X |
| 4,424,251 | 1/1984 | Sugishita et al. | 428/901 X |
| 4,465,727 | 8/1984 | Fujita et al. | 156/89 |
| 4,547,625 | 10/1985 | Tosaki et al. | 501/61 |

Primary Examiner—Caleb Weston
Attorney, Agent, or Firm—Antonelli, Terry & Wands

[57] ABSTRACT

This invention provides a ceramic multi-layer circuit board wherein electroconductive patterns and ceramic insulating layers are piled alternately, characterized in that each ceramic insulating layer is a sintered product comprising one or more kinds of silica and a glass. Since the glass has a softening point lower than the melting point of the material of the electroconductive patterns, it enables sintering of the ceramic multi-layer circuit board at low temperatures. The silica is effective for reduction of the dielectric constant of each ceramic insulating layer.

13 Claims, 1 Drawing Sheet

U.S. Patent  Aug. 16, 1988  4,764,233
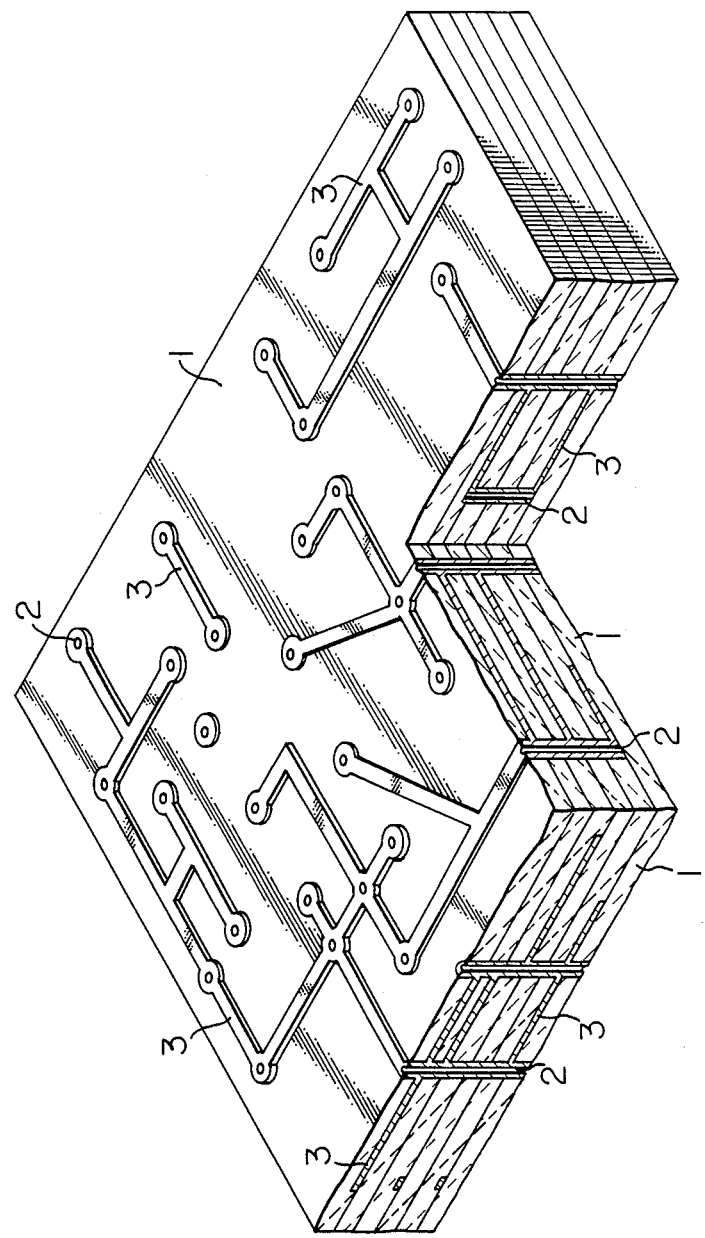

PROCESS FOR PRODUCING A CERAMIC MULTI-LAYER CIRCUIT BOARD

This application is a continuing application of application Ser. No. 511,903, filed July 8, 1983, now abandoned.

BACKGROUND OF THE INVENTION

1. Field of the Invention

This invention relates to a ceramic multilayer circuit board comprising ceramic substrates of a low dielectric constant and conductors of a low resistivity, and particularly to a ceramic substrate for mounting LSI circuits.

2. Description of the Prior Art

Keeping pace with a shift of electronic circuits to higher density, multi-layer circuit boards wherein semiconductor elements are mounted on ceramic substrates have come to be used in large quantities. As these ceramic substrates, alumina ceramics have hitherto been used from the standpoints of thermal conductivity, mechanical strength, electrical insulation property and so forth.

Alumina ceramics have relative dielectric constants as large as about 9 and are produced by sintering at high temperatures of about 1500° to 1650° C.

It is known that the relative dielectric constant of a ceramic substrate affects the signal transmission speed of an electronic circuit and their relation is represented by the equation:

$$t_d = \sqrt{\epsilon r} \cdot 1/c$$

wherein $t_d$ is the transmission delay of electric signals, $\epsilon r$ is the relative dielectric constant of a ceramic substrate, 1 is the transmission distance of the electric signals and c is the speed of light. A large relative dielectric constant means a delay in transmission of signals corresponding to the largeness of the relative dielectric constant. Accordingly, the fact that alumina ceramics have large relative dielectric constants is a drawback for alumina ceramic substrates. Further, the fact that alumina ceramics require high sintering temperatures restricts the kind of applicable conductor materials to those such as tungsten, molybdenum and the like having high melting points, because alumina ceramic substrates and conductor circuits formed on the substrates are together subjected to sintering. Both tungsten and molybdenum as conductor material are resistant to sintering but have resistivities as large as 5.2 to 5.5 μΩ·cm at room temperature. In circuit as 5.2 boards, when circuits are formed in high density, line widths are required to be narrower, whereby line resistances of circuits become larger, increasing voltage drop and delaying signal transmission speed. Hence, the use of these materials of high resistivities as conductor material is not desirable.

Thus, alumina ceramics having hitherto been used as substrates for multi-layer circuit boards have been disadvantageous in high speed transmission of circuit signals.

SUMMARY OF THE INVENTION

The object of this invention is to provide a ceramic substrate wherein the above-described drawback of conventional substrates is avoided and which has a small relative dielectric constant and can be sintered at a relatively low temperature, and at the same time to provide a multi-layer circuit board which uses the above ceramic substrate and a conductor composed of a low resistivity material and is advantageous in high speed signal transmission.

According to this invention, there is provided a ceramic multi-layer circuit board wherein a plurality of ceramic layers each having an electroconductive pattern on the upper surface are piled, characterized in that each of the ceramic layers is a sintered product comprising (a) a single silica or at least two kinds of silica different in crystal form and (b) a glass having a softening point lower than the melting point of the material of the electroconductive pattern.

As ceramic materials, there are required those having small relative dielectric constants. It is known that the following equation holds between relative dielectric constant $\epsilon r$ and delay in electric signal $t_d$.

$$t_d = \frac{\sqrt{\epsilon r} \cdot 1}{c}$$

In the above equation, $t_d$ is a delay in transmission of electric signals, $\epsilon r$ is the relative dielectric constant of a material, 1 is the transmission distance of signals and c is the speed of light. Accordingly, the transmission speed of signals can be made faster by selecting materials of small relative dielectric constants.

Of the inorganic materials, silica has the smallest relative dielectric constant of 3.8. Silica itself cannot be sintered at a temperature lower than 1400° C. On the other hand, silver having a volume resistivity of 1.6 μΩ·cm, copper having a volume resistivity of 1.7 μΩ·cm and gold having a volume resistivity of 2.2 μΩ·cm are conductor materials each excellent in electroconductivity and melting at 961° C., 1083° C. and 1063° C., respectively. The present inventors considered that, in order to use one of these conductor materials in circuit boards, ceramic materials must be selected which can be sintered at temperatures lower than the melting point of the conductor material. If ceramic materials cannot be sintered at such low temperatures, the conductor of a circuit pattern previously formed on a substrate by the printing method melts at the time of sintering the ceramic materials, whereby line burnout or short-circuiting may be caused. Hence, a technique is needed in which the small relative dielectric constant of silica is utilized and at the same time sintering at low temperatures is possible.

In this invention, an approach is taken in which a glass of a low softening point is added to silica and sintering is caused by the glass. The glass used in this invention can be any if it is chemically stable and has a softening point lower than the melting point of a material for an electroconductive pattern. Glasses of softening points of 1050° C. or lower are particularly desirable and these glasses include, for example, borosilicate glass, barium borosilicate glass, magnesium borosilicate glass, aluminum phosphate glass and the like. Low softening glasses containing lead oxide are also usable. Further, two or more kinds of low softening glasses can be used in combination. It is natural that, in selection of the glass, attention is paid to the level of the relative dielectric constant of the glass.

The electroconductive material for electroconductive patterns is desirably a metal selected from gold, silver and copper, or their alloys.

Raw materials of silica are, for example quartz, quartz glass, tridymite and cristobalite. When at least two kinds of silica different in crystal form are used together, there are used, as materials stable at room temperature, quartz glass, α-quartz, α-cristobalite, α-tridymite and the like and, as materials stable at high temperatures, β-quartz, β-cristobalite, β-tridymite and the like. By using together at least two kinds of silica different in crystal form, the thermal expansion coefficient of the resulting ceramic material can be controlled. In general, when the composition of a ceramic material is fixed, the thermal expansion coefficient of the ceramic material can be roughly estimated. By using together at least two kinds of silica different in crystal form, the thermal expansion coefficient of the resulting ceramic can be controlled optionally in the range of $1 \times 10^{-6}/°$ C. to $20 \times 10^{-6}/°$ C., for example, in the temperature range of room temperature to 400° C. The reason for being able to control the thermal expansion coefficient is that each silica crystal form has a different thermal expansion coefficient. Quartz glass has a thermal expansion coefficient of $0.5 \times 10^{-6}/°$ C. and quartz has a thermal expansion coefficient of 12 to $15 \times 10^{-6}/°$ C. Cristobalite has a thermal expansion coefficient of $10 \times 10^{-6}/°$ C. in the temperature range of room temperature to 200° C. and, when an abnormal thermal expansion occurring around 200° C. in connection with a phase transition from α-cristobalite to β-cristobalite is added, has a thermal expansion coefficient of $23 \times 10^{-6}/°$ C. in the temperature range of room temperature to 400° C. Tridymite has a thermal expansion coefficient of $23 \times 10^{-6}/°$ C. in the same temperature range when a thermal expansion occurring in connection with a phase transition from α crystal form to β crystal form is added. The thermal expansion coefficients of these kinds of silica are summarized in Table 1.

TABLE 1

| Kind of silica | Thermal expansion coefficient ($\times 10^{-6}/°$ C.) | |
| --- | --- | --- |
|  | 25° C. to 200° C. | 25° to 400° C. |
| Quartz glass | 0.5 | 0.6 |
| Quartz | 12 to 15 | 12 to 15 |
| Cristobalite | 10 | 23 |
| Tridymite | 10 | 23 |

Hence, by mixing at least two kinds of silica different in crystal form, the thermal expansion coefficient of the resulting ceramic material can be optionally controlled.

To prepare a multi-layer circuit board, there are also needed a lead conductor on each insulating ceramic substrate and a through-hole conductor for connecting each lead conductor. Silver, copper and gold used as conductors have thermal expansion coefficients of $1.91 \times 10^{-6}/°$ C., $17.0 \times 10^{-6}/°$ C. and $14.2 \times 10^{-6}/°$ C., respectively. If the ceramic substrate has a thermal expansion coefficient too largely different from those of the above conductors, in the cooling step after sintering there occur cracks of the ceramic and/or cutting of the conductors, which becomes disadvantageous for the multi-layer circuit board. To overcome this disadvantage it is necessary that the thermal expansion coefficient of a ceramic material can be optionally selected. According to this invention, the thermal expansion coefficient of the ceramic material can be made close to those of conductors.

With respect to particle sizes of ceramic raw materials, a finer particle diameter gives a ceramic substrate of a higher density and less surface unevenness. It is ideal that ceramic raw materials having particle diameters of 10 μm or smaller and particle sizes of 32 mesh or smaller be used.

The mixing ratio between silica and glass is not critical; except that too small a quantity of glass cannot combine silica. Hence, the quantity of silica is desired to be 5 to 95% by weight and ideally 20 to 80% by weight.

Next, there is described one example of a process for preparing a ceramic multi-layer circuit board which is the final object of this invention.

Firstly, a silica powder and a glass powder are weighed in a given mixing ratio. Thereto are added a binder, a plasticizer and a solvent to form a slurry. As the binder, there is used a polyvinyl butyral resin, a polymethacrylate resin or the like. As the plasticizer, there is used dioctyl phthalate. As the solvent, there is used methanol, trichloroethylene, toluene or the like. The slurry is spread on a resin film, for example, a polyester resin film in a sheet form having an adequate thickness (e.g. 0.1 to 1.0 mm) by the doctor blade method. By removing the solvent by drying, there is obtained a green ceramic sheet of a desired thickness. Holes of given diameters are made at predetermined positions of the green ceramic sheet by the punching method, the drilling method or the like. Further, on the surface of the sheet, there is printed a conductor paste of silver, gold or their alloy according to predetermined patterns. The paste is also filled inside the holes according to the printing method to form through-holes which later penetrate piled green sheets and connect conductor patterns. The green sheet in which conductor patterns and through-holes have been formed is piled in the form of a multi-layer and then sintered. In the sintering of green sheets on which a copper conductor has been printed, a forming gas atmosphere is used which is a mixture of nitrogen and hydrogen. To this gas is added water as an oxidizing source for the binder, the plasticizer and the like. In the sintering of green sheets on which a silver or gold conductor has been printed, a nitrogen gas or air atmosphere can be used. This atmosphere is used because both silver and gold are not oxidized. The sintering temperature varies depending upon the composition of the glass used, particle sizes of raw materials and the kind of the conductor, however, it is desirable to be at least 900° C. and not higher than 1050° C. When the sintering temperature exceeds 1050° C, copper melts and there occur line burnout and short-circuiting. The sintering is completed in about several minutes to about 1 hr although the time length of the sintering varies by the sintering temperature. Ideally, the sintering temperature is 800° to 900° C. for silver and 800° to 1000° C. for gold. Regardless of the kind of the conductor, when a tunnel-shaped furnace is used for sintering, there are cases where the sintering time from the furnace inlet to the furance outlet is as long as 24 hr.

By the above process, a ceramic multi-layer circuit board is produced which has a through-hole conductor and a lead conductor between layers.

BRIEF DESCRIPTION OF THE DRAWING

The accompanying drawing is a fragmentary sectional perspective view of a ceramic multi-layer circuit board according to one embodiment of this invention.

DETAILED DESCRIPTION OF THE PREFERRED EMBODIMENTS

Hereinunder, examples of this invention are illustrated. In each example, parts refer to parts by weight and % refers to % by weight.

The composition and characteristics of each low softening glass used as a raw material are shown in Table 2. Shown in Table 3 are (a) the mixing ratio of basic raw materials of each ceramic material, namely, a low softening glass and two or three kinds of silica different in crystal form, (b) the sintering temperature of each mixture and (c) the characteristics of each sintered product. As is obvious from Table 3, the relative dielectric constants of the sintered products obtained are all between 4.0 and 5.0 and not much different from each other but their thermal expansion coefficients widely range from $3.2 \times 10^{-6}/°C$ to $10.3 \times 10^{-6}/°C$. The thermal expansion coefficient of a sintered ceramic material can be controlled by changing the mixing ratio of a glass and silica as well as the kinds of silica different in crystal form.

TABLE 2

| No. | Composition (% by weight) | | | | | | | | | | Characteristics | |
|---|---|---|---|---|---|---|---|---|---|---|---|---|
| | $SiO_2$ | $Al_2O_3$ | MgO | BaO | $B_2O_3$ | $AlPO_4$ | $MgF_2$ | $K_2O$ | $N_2O$ | $Bi_2O_2$ | Softening point (°C.) | Relative dielectric constant (at 1 MHz) |
| 1 | 40~50 | 20~25 | 10~15 | — | 5~15 | — | — | — | — | 5~15 | 900~1000 | 5.0~6.0 |
| 2 | 20~30 | 15~20 | 5~10 | — | 30~50 | — | — | — | — | 5~15 | 700~800 | 4.5~5.5 |
| 3 | 20~30 | 15~20 | 5~10 | — | 40~60 | — | — | — | — | — | 700~800 | 4.0~5.0 |
| 4 | 15~30 | 10~20 | — | 20~25 | 30~50 | — | — | — | — | — | 650~740 | 4.8~5.5 |
| 5 | 20~30 | 15~23 | — | 25~30 | 20~30 | — | — | — | — | — | 750~800 | 5.0~5.7 |
| 6 | 35~50 | 5~15 | — | 7.5~15 | 25~40 | — | — | 0~0.1 | 0~0.1 | — | 700~800 | 4.1~4.5 |
| 7 | 40~60 | 5~15 | — | 5~15 | 20~30 | — | — | 1~4.5 | 1~4.5 | — | 650~750 | 4.5~5.3 |
| 8 | 20~40 | — | — | — | 20~40 | 20~40 | 5~15 | — | — | — | 650~750 | 4.0~5.0 |
| 9 | 60~80 | 0~2 | — | — | 20~30 | — | — | 1~3 | 1~3 | — | 700~800 | 4.0~5.0 |
| 10 | 30~50 | — | — | — | 20~40 | 20~40 | — | — | — | — | 730~820 | 4.0~5.0 |
| 11 | 30~40 | 15~20 | 5~10 | — | 30~50 | — | — | — | — | — | 700~800 | 4.0~5.0 |
| 12 | 35~45 | 5~15 | 2.5~7.5 | — | 30~50 | — | — | 1.5~5 | — | — | 650~750 | 4.6~5.0 |

TABLE 3

| No. | Mixing ratio (% by weight) | | | | | | Characteristics of sintered ceramic | | |
|---|---|---|---|---|---|---|---|---|---|
| | Low softening glass | | Silica | | | | Sintering temperature (°C.) | Relative dielectric constant | Thermal expansion coefficient ($\times 10^{-6}/°C.$) |
| | Glass No. | % | Name | % | Name | % | | | |
| 14 | 4 | 60 | Quartz glass | 35 | Quartz | 5 | 800 | 4.0 | 3.2 |
| 15 | " | " | Quartz glass | 30 | Quartz | 10 | " | 4.2 | 4.0 |
| 16 | " | " | Quartz glass | 20 | Quartz | 20 | " | 4.5 | 5.5 |
| 17 | " | " | Quartz glass | 10 | Quartz | 30 | " | 4.5 | 7.0 |
| 18 | " | " | Quartz glass | 5 | Quartz | 35 | " | 5.0 | 7.8 |
| 19 | " | 40 | Quartz glass | 30 | Quartz | 30 | 900 | 4.2 | 6.3 |
| 20 | " | " | Quartz glass | 10 | Quartz | 50 | " | 4.8 | 9.2 |
| 21 | 7 | 50 | Quartz glass | 30 | Quartz | 20 | 850 | 4.5 | 5.2 |
| 22 | " | " | Quartz glass | 10 | Quartz | 40 | " | 4.6 | 8.0 |
| 23 | " | 70 | Quartz glass | 15 | Quartz | 15 | 800 | 5.0 | 5.1 |
| 24 | " | 80 | Quartz glass | 10 | Quartz | 10 | " | " | 4.8 |
| 25 | " | 90 | Quartz glass | 5 | Quartz | 5 | 800 | " | 4.5 |
| 26 | 12 | 40 | Quartz glass | 50 | Quartz | 10 | 850 | 4.0 | 3.5 |
| 27 | " | " | Quartz glass | 40 | Quartz | 20 | " | 4.3 | 4.5 |
| 28 | " | " | Quartz glass | 30 | Quartz | 30 | " | 4.6 | 6.4 |
| 29 | 12 | 40 | Quartz glass | 20 | Quartz | 40 | 850 | 4.8 | 8.5 |
| 30 | " | " | Quartz glass | 10 | Quartz | 50 | " | " | 9.0 |
| 31 | " | 60 | Quartz glass | 20 | Quartz | 20 | 800 | 4.7 | 6.0 |
| 32 | " | 80 | Quartz glass | 5 | Quartz | 15 | " | " | 6.2 |
| 33 | " | 90 | Quartz glass | " | Quartz | 5 | " | 4.5 | 6.1 |

TABLE 3-continued

| | Mixing ratio (% by weight) | | | | | | Characteristics of sintered ceramic | |
|---|---|---|---|---|---|---|---|---|
| | Low softening glass | | | Silica | | Sintering temperature (°C.) | Relative dielectric constant | Thermal expansion coefficient ($\times 10^{-6}$/°C.) |
| No. | Glass No. | % | Name | % | Name | % | | |
| 34 | " | 60 | Quartz glass | 20 | Cristobalite | 20 | " | 4.6 | 5.3 |
| 35 | " | " | Quartz glass | 10 | Cristobalite | 30 | " | 4.7 | 6.3 |
| 36 | 2 | " | Quartz glass | 10 | Cristobalite | " | " | 4.3 | 6.1 |
| 37 | " | " | Quartz glass | 20 | Cristobalite | " | " | 4.2 | 5.0 |
| 38 | " | " | Quartz glass | 10 | Tridymite | 30 | " | 4.4 | 6.0 |
| 39 | " | " | Quartz glass | 20 | Tridymite | 20 | " | 4.2 | 5.2 |
| 40 | 12 | " | Quartz | 20 | Cristobalite | 20 | 800 | 4.7 | 8.0 |
| 41 | " | " | Quartz | 20 | Tridymite balite | " | " | " | 8.2 |
| 42 | " | " | Cristobalite | " | Tridymite | " | " | 4.8 | 7.0 |
| 43 | 5 | " | Quartz glass | 10 | Cristobalite | 30 | 850 | 4.5 | 6.0 |
| 44 | " | " | Quartz glass | 20 | Cristobalite | 20 | " | " | 5.2 |
| 45 | " | " | Quartz glass | " | Tridymite | " | " | 4.6 | 5.1 |
| 46 | " | " | Quartz | " | Cristobalite | " | " | 5.0 | 8.2 |
| 47 | " | " | Quartz | " | Tridymite | " | " | 4.9 | 8.3 |
| 48 | " | " | Cristobalite | " | Tridymite | " | " | 4.8 | 7.5 |
| 49 | 7 | " | Quartz glass | 10 | Quartz | " | 800 | 4.5 | 6.0 |
| | | | | | Cristobalite | 10 | | | |
| 50 | " | " | Quartz glass | 5 | Quartz | 20 | 800 | 4.6 | 7.5 |
| | | | | | Cristobalite | 15 | | | |
| 51 | " | 50 | Quartz glass | " | Quartz | 45 | " | 4.5 | 9.5 |
| 52 | " | 40 | Quartz glass | " | Quartz | 55 | 850 | 4.6 | 10.3 |
| 53 | " | 30 | Quartz glass | " | Cristobalite | 65 | 900 | 4.6 | 8.2 |
| 54 | 12 | 50 | Quartz | 45 | Cristobalite | 5 | 850 | 4.5 | 9.7 |
| 55 | " | " | Cristobalite | 25 | Tridymite | 25 | " | 4.6 | 7.5 |

EXAMPLE 1

According to the mixing ratio shown in Table 3, total 100 parts of ceramic raw materials were weighed and mixed for 24 hr in a ball mill. Thereto were added 6.0 parts of a polyvinyl butyral resin, 2.4 parts of dioctyl phthalate, 23.0 parts of trichloroethylene, 9.0 parts of perchloroethylene and 6.0 parts of butyl alcohol, and all materials were mixed for 10 hr in the ball mill, whereby the mixture became a slurry. The slurry was spread on a polyester film by the doctor blade method in a sheet form of 0.25 mm thickness. The sheet was heated at the highest temperature of 120° C. to evaporate the solvents to obtain a green sheet. The green sheet was cut into a predetermined dimension. At predetermined positions of each sheet, throughholes were made by the punching method and a conductor paste of silver was filled inside the holes by the printing method to form a conductor for connecting leads on each ceramic layer. On the upper surface of each sheet, a lead conductor was printed according to a predetermined pattern. Six green sheets, on each of which the silver conductor had been printed, were piled by the use of guide holes and forced to adhere to each other at 120° C. by a pressure of 10 kg/cm².

A plurality of the resulting multi-layer green sheets were packed in a furnace and sintered in an air atmosphere. The sintering was conducted for about 30 min at a sintering temperature shown in Table 3.

According to the above process, there were produced ceramic multi-layer circuit boards with a section as shown in the drawing. Each green sheet lost the resin components in the sintering step and became a ceramic layer 1. Each ceramic layer 1 was sintered to combine with each other. On the upper surface of each ceramic layer 1, a conductor layer 3 is formed according to a desired lead pattern. 2 is throughholes penetrating ceramic layers 1. These through-holes 2 are connected to the conductor layers 3 at predetermined positions on the upper surface of each ceramic layer 1.

According to the above process, there were obtained ceramic multi-layer circuit boards having six conductor layers. These circuit boards used a silver conductor and gave a line width of 80 μm and a line resistance of 0.4 Ω/cm.

EXAMPLE 2

According to the mixing ratio shown in Table 3, total 100 parts of ceramic raw materials were weighed and mixed for 24 hr in a ball mill. Thereto were added 5.9 parts of a methacrylate resin, 2.4 parts of dioctyl phthalate, 23.0 parts of trichloroethylene, 9.0 parts of perchloroethylene and 6.0 parts of butyl alcohol, and all materials were mixed for 10 hr in the ball mill, whereby the mixture became a slurry. The slurry was spread on a polyester film by the doctor blade method in a sheet form of 0.25 mm thickness. The sheet was heated at the highest temperature of 120° C. to evaporate the solvents to obtain a green sheet. The green sheet was cut into a predetermined dimension. At predetermined positions of each green sheet, throughholes and guide holes were made by the punching method. A copper conductor paste was filled inside the throughholes for later connection of each ceramic layer and a lead pattern was formed on the upper surface of each green sheet. Six green sheets, on each of which the copper conductor paste had been formed, were piled by the use of guide holes and forced to adhere to each other at 120° C. by a pressure of 15 kg/cm$^2$.

A plurality of the resulting multi-layer green sheets were packed in a furnace and sintered. The atmosphere in the sintering was a nitrogen gas containing 3 to 7% of hydrogen. A slight quantity of water vapor was introduced into the gas to promote the thermal decomposition of the organic binder. The sintering was conducted at a sintering temperature shown in Table 3, whereby ceramics were obtained.

According to the above process, multi-layer circuit boards having six conductor layers were produced. These circuit boards used a copper lead and gave a line width of 80 μm and a line resistance of 0.4 Ω/cm.

EXAMPLE 3

Green sheets were prepared in a manner similar to that of Example 1. As the conductor, a gold paste was used. These green sheets were sintered in an air atmosphere similarly to Example 1.

The resulting multi-layer circuit boards having six conductor layers gave a line width of 80 μm and a line resistance of 0.45 Ω/cm.

In Examples 1 to 3, the relative dielectric constants of the sintered ceramics are small, conductors of a low line resistance can be used because the sintering temperatures of ceramic raw materials are lower than the melting point of silver, copper, gold or their alloys and the thermal expansion coefficients of the sintered ceramics can be controlled in the approximate range of $3 \times 10^{-6}$/° C. to $10 \times 10^{-6}$/° C., whereby there can be obtained ceramic multi-layer circuit boards giving fast signal transmission speeds and free from cracks, conductor cutting and shortcircuiting.

EXAMPLE 4

20 to 30% of $SiO_2$, 15 to 20% of $Al_2O_3$, 5 to 10% of MgO, 30 to 50% of $B_2O_3$ and 5 to 15% of $Bi_2O_3$ were mixed. This mixture was placed in a platinum crucible and melted at 1400° C. The melt was cooled rapidly down to room temperature to form a uniform glass. The glass had a low softening point of 850° to 950° C. This glass was ground into 325 mesh or smaller to use as a raw ceramic material.

Quartz glass was ground into 325 mesh or smaller. 5 to 95 parts of this quartz glass and 95 to 5 parts of the glass prepared above were weighed in four combinations. Each combination was placed in a ball mill and mixed for 24 hr. Thereto were added 5.9 parts of a methacrylate resin, 2.4 parts of dioctyl phthalate, 23.0 parts of trichloroethylene, 9.0 parts of perchloroethylene and 6.0 parts of butyl alcohol, and the materials were mixed for 3 hr in the ball mill, whereby the mixture became a slurry. The slurry was spread on a Mylar film by the use of the doctor blade method to form a sheet of 0.2 mm thickness. The sheet was heated at the highest temperature of 100° C. to evaporate the solvents to form a green sheet. The green sheet was cut into a predetermined dimension (70×70 mm). At predetermined positions of each green sheet, throughholes were made by the punching method and a conductor paste of copper was filled inside the holes for later connection of each ceramic layer. The same conductor paste was applied on the upper surface of each green sheet by the screen printing method to form a pattern. Six green sheets, on each of which a copper conductor pattern had been formed, were piled by the use of guide holes and then forced to adhere to each other at 120° C. by a pressure of 7 kg/cm$^2$.

A plurality of the resulting multi-layer green sheets were packed in a furnace and sintered. As the sintering atmosphere, nitrogen containing 3 to 7% of hydrogen was used. A slight quantity of water vapor was introduced into the gas to promote the thermal decomposition of the organic binder. The green sheets were held in the furnace for at least 30 min at the highest temperature of 950° C. and then cooled.

According to the above process, multi-layer circuit boards having six conductor layers were produced. These circuit boards used a copper conductor and gave a conductor resistivity of 2.5 μΩ·cm. Also, the relative dielectric constant of each ceramic material comprising the quartz glass and the low softening glass was 5.2 (quartz glass/l.s.glass=5/95), 4.6 (30/70), 4.5 (50/50) and 4.2 (95/5).

EXAMPLE 5

Quartz glass was ground into 325 mesh or smaller. 5 to 95 parts of this quartz glass and 95 to 5 parts of a glass composed of 40% of $SiO_2$, 10% of $Al_2O_3$, 5% of MgO, 40% of $B_2O_3$ and 5% of $K_2O$ were weighed out, placed in a ball mill and mixed for 24 hr. Thereto were added 5.9 parts of a polyvinyl butyral as binder, 2.4 parts of dibutyl phthalate as plasticizer, and as solvent, 23.0 parts of trichloroethylene, 9.0 parts of perchloroethylene and 6.0 parts of butyl alcohol, on the basis of 100 parts of the ceramic raw materials. The materials were mixed in the ball mill. The resulting slurry was made into a green sheet having a uniform thickness of 0.2 mm by the doctor blade method. The green sheet was cut into a predetermined dimension (70×70 mm). At predetermined positions of each green sheet, through-holes were made by the punching method. A silver conductor paste was filled inside the holes for later connection of each ceramic layer. The same conductor paste was applied on the upper surface of each green sheet by the screen printing method to form a pattern. Six green sheets, on each of which a silver conductor pattern had been formed, were piled by the use of guide holes and then forced to adhere to each other at 90° C. by a pressure of 7 kg/cm².

A plurality of the resulting multi-layer green sheets were packed in a furnace and sintered. A sintering atmosphere of air was used. The green sheets were held in the furnace for at least 15 min at the highest temperature of 900° C. and then cooled.

According to the above process, multi-layer circuit boards having six conductor layers were produced. These circuit boards used a silver conductor and gave a conductor resistivity of 2 $\mu\Omega$·cm. Hence, the line width of conductor patterns was 70 $\mu$m, and the line resistance per line length of 1 cm was 0.4 $\mu$/cm. The tungsten conductor hitherto used in alumina multi-layer circuit boards shows a resistivity of 15 $\mu\Omega$·cm and its line resistance for the same line width of 70 $\mu$m and the same line length of 1 cm is 1 $\mu$/cm. In multi-layer circuit boards of this example, the conductor resistance is small and accordingly voltage drop is small and there is no delay in signal transmission. Further, the relative dielectric constants of the ceramic materials were 4.3 to 5.0. This gives faster signal transmission speeds compared with those of alumina ceramic materials having a relative dielectric constant of 9.

EXAMPLE 6

5 to 95 parts of quartz powder and 95 to 5 parts of the glass used in Example 4 were weighed out, placed in a ball mill and mixed for 24 hr. Thereto were added 5.9 parts of a methacrylate resin, 2.4 parts of dibutyl phthalate, 23.0 parts of trichloroethylene, 9.0 parts of perchloroethylene and 6.0 parts of butyl alcohol, and all materials were mixed for 3 hr in the ball mill, whereby the mixture became a slurry. From the slurry was made a green sheet of 0.2 mm thickness by the doctor blade method. The green sheet was cut into a predetermined dimension (70×70 mm). At predetermined positions of each green sheet, through-holes were made by the punching method. A copper conductor paste was filled inside the holes, for later connection of ceramic layers, by the screen printing method. Then, a predetermined lead pattern was formed on the upper surface of each green sheet. Ten green sheets, on each of which the copper conductor paste had been printed according to the predetermined pattern, were piled by the use of guide holes in a predetermined order. These piled sheets were forced to adhere to each other at 120° C. by a pressure of 7 kg/cm² to prepare a board consisting of ten green sheets.

A plurality of the resulting multi-layer green sheets were packed in a furnace and sintered. As the sintering atmosphere, there was used a forming gas containing 3 to 7% of hydrogen. A slight quantity of water vapor was introduced to promote the thermal decomposition of the organic binder. The highest sintering temperature was 950° C. 8 Hr was taken to increase to 950° C. and this temperature was held for 1 hr and thereafter 8 hr was taken to cool down to room temperature, whereby the sintering was completed.

According to the above process, multi-layer circuit boards having ten conductor layers were produced. These multi-layer boards gave a conductor resistance of 0.4 $\mu$/cm (line width: 70 $\mu$m) and the ceramic materials showed relative dielectric constants of 4.6 to 5.2, and accordingly fast signal transmission speeds were obtained.

EXAMPLE 7

A glass having a softening point of 730° C. and composed of 20 to 30% of $SiO_2$, 15 to 20% of $Al_2O_3$, 5 to 15% of MgO and 40 to 60% of $B_2O_3$ was prepa To 95 to 5% of this glass was added 5 to 95% of quartz glass, and similarly to Example 5 or 6, multi-layer circuit boards were produced. In these boards, the ceramic materials showed relative dielectric constants of 4.4 to 5.5.

According to the above Examples, a metal of low resistance such as copper or silver can be used as a conductor for multi-layer circuit boards. Hence, a line resistance of the conductor can be made small even when the line width of the conductor is made narrow and thereby a multi-layer circuit board of high density can be produced.

What is claimed is:

1. A process for producing a ceramic multi-layer circuit board, wherein a plurality of ceramic layers each having a conductor pattern on an upper surface are piled, which comprises making a mixture of (1) 20 to 80% by weight of single silica, said single silica being at least two kinds of single silica, the at least two kinds of single silica being different from each other in crystal form, each of the at least two kinds of single silica having an average particle size of not more than 10 $\mu$m, the at least two kinds of single silica different from each other in crystal form being selected from the group consisting of critobolite, tridymite, quarta glass and quartz, and (2) 80 to 20% by weight of at least one kind of low melting point glass having a lower softening point than that of a metal forming said conductor pattern and having an average particle size of not more than 10 $\mu$m, said at least one kind of low melting point glass being selected from the group consisting of borosilicate glass, barium borosilicate glass, magnesium borosilicate glass, aluminum phosphate glass and lead oxide-containing low softening point glass; forming said mixture into a slurry together with an organic synthetic resin-based binder and a solvent; forming a sheet from the slurry on a flexible film; removing the solvent therefrom, thereby obtaining a green sheet; depositing a circuit conductor of a metal selected from the group consisting of gold, silver, copper or their alloys, on the green sheet, in a desired pattern form; piliing a plurality of the green sheets to form a laminate thereof; and firing the piled green sheets at a temperature lower than the melting point of the circuit conductor metal, thereby obtaining a fired ceramic where the single silica is evenly distributed in the matrix of the low melting point glass.

2. The process according to claim 1, wherein a plasticizer is further added in forming the mixture into a slurry.

3. The process according to claim 1, wherein said firing is performed so as to sinter the piled green sheets.

4. The process according to claim 1, wherein said mixture consists essentially of said at least two kinds of single silica different from each other in crystal form and said at least one kind of low melting point glass.

5. The process according to claim 1, wherein the resulting fired ceramic has a thermal expansion coefficient in the range of $1\times10^{-6}$/°C. to $20\times10^{-6}$/°C. in the temperature range of room temperature to 400° C.

6. The process according to claim 1, wherein, after obtaining the green sheet and before depositing the circuit conductor, holes are formed in the green sheet so as to form through-holes through the green sheet.

7. The process according to claim 6, wherein the depositing a circuit conductor includes depositing the metal for the circuit conductor in said holes so as to connect conductor patterns when a plurality of the green sheets are piled to form a laminate thereof.

8. The process according to claim 1, wherein the at least two kinds of single silica different from each other in crystal form are provided in making the mixture so as to control the thermal expansion coefficient of the resulting ceramic material.

9. The process according to claim 8, wherein the thermal expansion coefficient of the resulting ceramic material is controlled to be in the range of $1 \times 10^{-6}/°C$. to $20 \times 10^{-6}/°C$. in the temperature range of room temperature to 400° C.

10. The process according to claim 9, wherein the at least two kinds of single silica different from each other in crystal form are provided in making the mixture so as to control the thermal expansion coefficient of the resulting ceramic material to correspond to that of the metal forming the circuit conductor pattern.

11. The process according to claim 10, wherein the mixing ratio of the single silica and the low melting point glass is controlled so as to control the thermal expansion coefficient of the resulting ceramic material.

12. The process according to claim 11, wherein the particles of the at least two kinds of single silica and the particles of the at least one kind of low melting point glass have particle sized of 325 mesh or smaller.

13. The process according to claim 11, wherein the firing is performed at a temperature between 800° C. and 1050° C.

* * * * *